United States Patent

Morita et al.

[11] Patent Number: 5,218,328
[45] Date of Patent: Jun. 8, 1993

[54] STRUCTURE FOR A RESONATOR USING AN ULTRATHIN PIEZOELECTRIC SUBSTRATE

[75] Inventors: Takao Morita; Osamu Ishii; Takebumi Kurosaki, all of Kanagawa, Japan

[73] Assignee: Toyo Communication Equipment Co., Ltd., Kanagawa, Japan

[21] Appl. No.: 768,909

[22] PCT Filed: Oct. 2, 1990

[86] PCT No.: PCT/JP90/01273
§ 371 Date: Oct. 7, 1991
§ 102(e) Date: Oct. 7, 1991

[87] PCT Pub. No.: WO91/12662
PCT Pub. Date: Aug. 22, 1991

[30] Foreign Application Priority Data

Feb. 9, 1990 [JP] Japan .................. 2-29935

[51] Int. Cl.$^5$ .............................. H03H 9/19
[52] U.S. Cl. .................. 333/187; 310/321; 310/348; 310/361
[58] Field of Search ............. 333/187, 1, 192; 310/321, 323, 340, 345, 348, 349, 351, 353, 361

[56] References Cited

U.S. PATENT DOCUMENTS 3,453,458 7/1969 Curran et al. ............... 333/189 X
3,694,677 9/1972 Guttwein et al. ............ 333/187 X
4,612,471 9/1986 Nakamura et al. ........... 333/348 X

FOREIGN PATENT DOCUMENTS 53-12292  2/1978 Japan .
54-107293 8/1979 Japan .
58-219810 12/1983 Japan .
61-3513   1/1986 Japan .
0180109   7/1989 Japan ................. 333/187

Primary Examiner—Robert J. Pascal
Assistant Examiner—Seung Ham
Attorney, Agent, or Firm—Fish & Richardson

[57] ABSTRACT

In a resonator which has an ultrathin vibratory portion formed integrally with a thick frame-like rib surrounding it, a pair of opposed thick marginal portions of the frame-like rib are formed so that their widths gradually decreases toward another marginal portion of the rib from the other remaining one perpendicular to the above-noted pair of opposed marginal portions and to be fixed to a resonator case. This structure substantially increases the mechanical strength of the piezoelectric resonator, even if it is held in a cantilever fashion, and protects it from breakage by an external vibration or shock.

10 Claims, 4 Drawing Sheets

Direction cracking develops

STRUCTURE FOR A RESONATOR USING AN ULTRATHIN PIEZOELECTRIC SUBSTRATE

TECHNICAL FIELD

The present invention relates to improvement in mechanical strength of a resonator using an ultrathin piezoelectric substrate which is capable of providing resonance frequencies as high as tens to hundreds of megahertz through fundamental vibration.

BACKGROUND ART

In recent years there has been a strong and growing demand for high frequency operation and high frequency stability of various pieces of electronic and communication equipment. An ordinary AT cut quartz crystal resonator, which has heretofore been used widely as a piezoelectric device (such as an ordinaly resonator or filter), has a very excellent temperature-frequency characteristic; however, since its resonance frequency is in inverse proportion to its thickness, the fundamental frequency of this kind of resonator with a mechanical strength sufficient for practical use is around 40 MHz at the highest.

There has also been widely employed what is called overtone oscillation means which extracts a higher order harmonic mode vibration of an AT cut quartz crystal resonator to obtain a frequency which is an odd multiple of the fundamental resonance frequency, but its oscillation circuit calls for an LC tuning circuit including a coil and hence is not suitable for fabrication as a semiconductor IC, besides the overtone oscillation circuit may sometimes be difficult of activation because such resonator has a large capacitance ratio, and hence a high impedance level.

On the other hand, a surface acoustic wave(SAW) resonator, whose oscillation frequency is determined by the pitch of electrode fingers of interdigital transducer, has come to be able to output a maximum of 1 GHz or sodue to the progress in photolithography, but a piezoelectric substrate usable for the SAW resonator is remarkably inferior to the AT cut quartz crystal in terms of temperature-frequency characteristic.

To solve the above-mentioned problems, there has been proposed such a piezoelectric resonator as shown in FIGS. 4(a) and (b).

That is, a recess 5 is formed, by machining or etching, in one side of a block of AT cut quartz crystal substantially centrally thereof and the thickness of a vibratory portion 2 forming the bottom of the cavity 5 is selected about 16 μm, for example, if a fundamental resonance frequency of 100 MHz is desired to obtain.

A conductive thin film is evaporated onto the surfaces of the ultrathin vibratory portion 2 and a thick frame-like marginal portion (of a rib) 3 surrounding the recess 5 and the inner wall surface of the marginal portion to form an overall electrode 12 on the side of the quartz crystal block 1 where the recess 5 is formed. Further, a partial electrode 14 is formed on the opposite side of the vibratory portion centrally thereof.

It is customary and technically advantageous that the quartz crystal resonator of the above structure is fixedly mounted upside down—with the recess 5 facing downward—in a ceramic or similar case 11 which has a concave housing space 10 centrally thereof as shown in FIG. 5. In this instance, the surface 3a of the frame-like marginal portion 3 is mechanically bonded and electrically connected, through a conductive adhesive coated inline thereon, to a conductive film 16 which is exposed on the bottom of the case 11 and hermetically passing there through for connection to an external lead member 18.

By employing such a structure of supporting the quartz crystal resonator at only one side 3a of the rib (which structure will hereinafter referred to as a cantilever structure) so that the marginal portion 3b at the opposite side is held in mere contact with or slightly apart from the conductive film 16, the freedom of vibration of the vibratory portion 2 is not seriously suppressed—this prevents the Q of the resonator from deterioration and its resonance frequency from being changed by the sealing of the case and provides less scattering temperature-frequency characteristics in the case of mass production of the resonator.

To maximize the freedom of vibration of the quartz crystal block, it is desirable that the partial electrode 14 formed on the flat side of the quartz crystal block be connected, by wire bonding, via an end of a lead pattern extending from said partial electrode 14 to a pad 21 formed on a stepped portion 20 of the case. Needless to say, the pad 21 is connected to another external lead member 24 formed on the underside of the case, via a conductor 23 hermetically passing through the case.

Such a piezoelectric device is completed by hermetically sealing the opening of the case with a lid 25 after the resonator 1 is housed in position in the case 11.

In such a device using an ultrathin quartz crystal plate it is customary to hold the quartz crystal resonator 1 at one margin 3a of the frame-likerib in a cantilever fashion. With such a structure, however, a vibration or shock, when appliedthereto, flapping occurs about the marginal portion 3a and the frame-like rib cannot withstand the resulting stress or loading, and hence readily suffers from cracking which develops in such a direction shown in FIG. 4(a).

An object of the invention is to provide a structure for a piezoelectric resonator which ensures preventing its breakage by supporting the ultrathin vibratory portion whit a thick frame-like rib formed along the marginal edge of quartz crystal or similar piezoelectric block.

DISCLOSURE OF THE INVENTION

To attain the above objective, according to the present invention, in the piezoelectric resonator of the type having a thick frame-like rib formed as a unitary structure with the ultrathin vibratory portion a pair of opposed marginal portions of the frame-like rib are formed so that their widths gradually decrease toward another marginal portion of the frame-like rib which is the above-mentioned pair of marginal portions and is to be fixedly bonded to the resonator case.

BEST MODE FOR CARRYING OUT THE INVENTION

The present invention will hereinafter be described in detail with reference to its preferred embodiments depicted in the accompanying drawings.

Figure 1A:
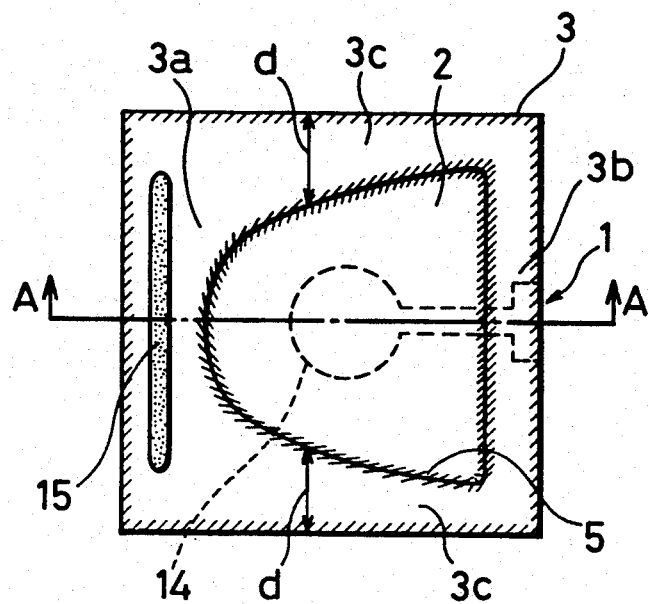
FIGS. 1(a), (b) and (c) are plan, perspective and sectional views illustrating a first embodiment of the quartz crystal resonator according to the present invention.
Figure 1B:
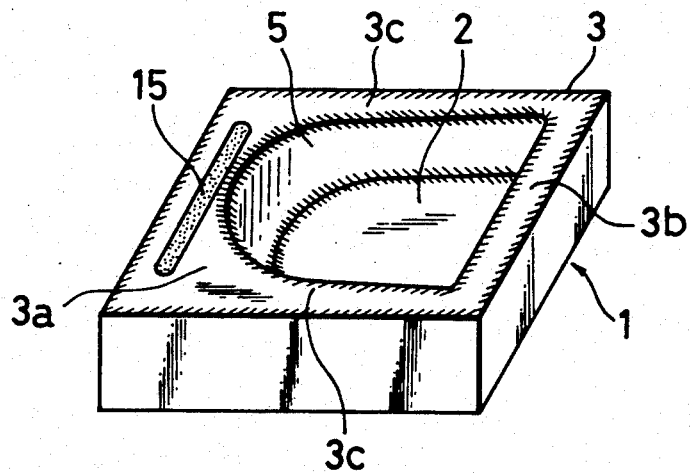
Figure 1C:
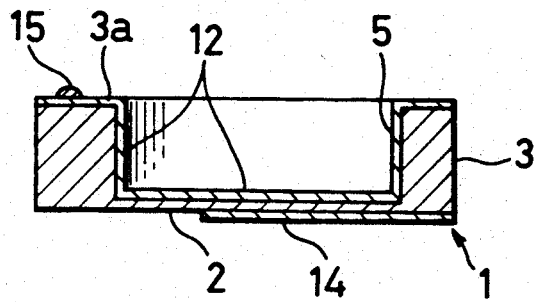

FIGS. 1(a), (b) and (c) are a plan view and a perspective view illustrating a first embodiment of the quartz crystal resonator according to the present invention and a sectional view taken on the line A—A in FIG. 1(a). A recess 5, saddle-shaped as viewed from above, is formed by etching or machining in the central portion of a rectangular quartz crystal block 1 of crystal so that the bottom of the recess forms an ultrathin vibratory portion 2 and that those marginal portions 3c, 3c of a frame-like rib 3 formed integrally with the vibratory portion 2 around the periphery thereof which are perpendicular to another marginal portion 3a of the rib to be coated with an adhesive gradually increase their widths d as the marginal portion to be bonded to the afore-mentioned resonator case is approached.

Figure 5:
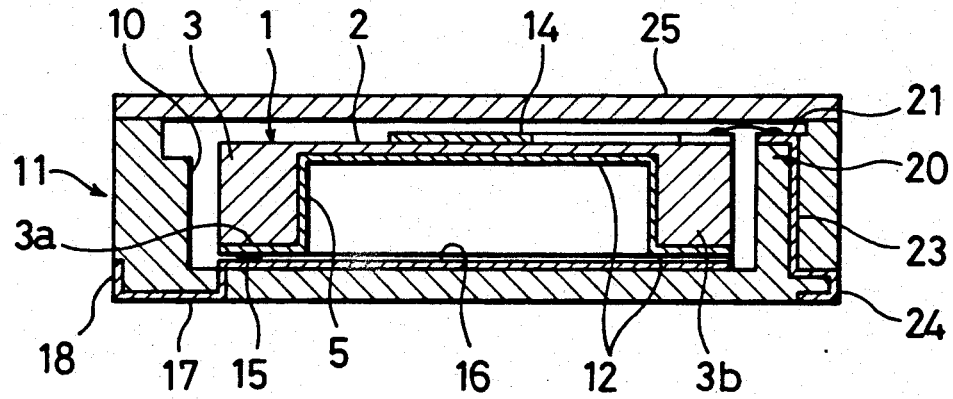
Figure 4:
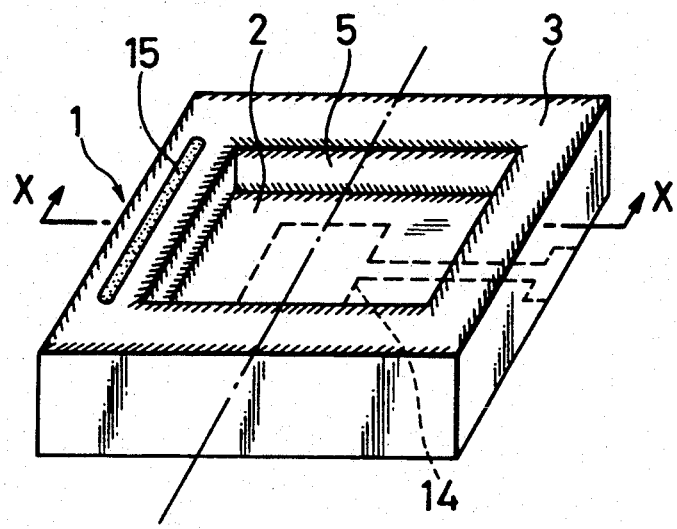
FIGS. 4(a), (b) and 5 are perspective and sectional views showing the structure of a resonator of the type which was developped by the inventors of this invention and a diagram for explaining how to fixedly mount the resonator in its case.
Figure 4:
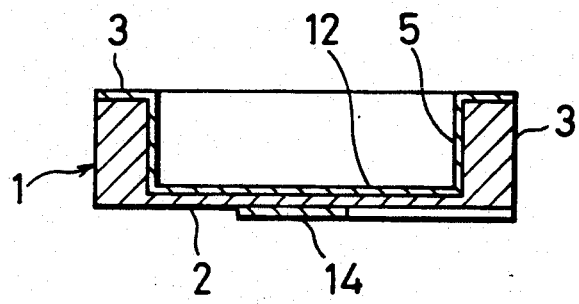

With such a structure as noted above, it is possible to effectively protect from cracking by vibration or shock, even if the resonator is held in the case through use of the cantilever structure shown in FIG. 5.

While the structure of the above embodiment has been described to be used for preventing breakage of the quartz crystal block which is fixedly held in the cantilever fashion in the resonator case, the quartz crystal of such a structure need not always be held in the cantilever fashion. Since the widths d of the marginal portions 3c of the frame-shaped rib gradually increase toward the marginal portion 3a to be coated with an adhesive so that the width of the recess gradually decreases toward the marginal portion 3a, the mass of the quartz crystal block 1 per unit length decreases toward the opposite marginal portion 3b, and in addition, the mechanical strength of the frame-like rib increases as the marginal portion 3a is approached. Thus, this structure is effective for protecting the resonator from breakage by flapping due to a vibration or shock applied thereto.

Incidentally, other structures which produce the same effect as that obtainable with the first embodiment of the present invention fall inside of the scope of the invention.

Figure 2:
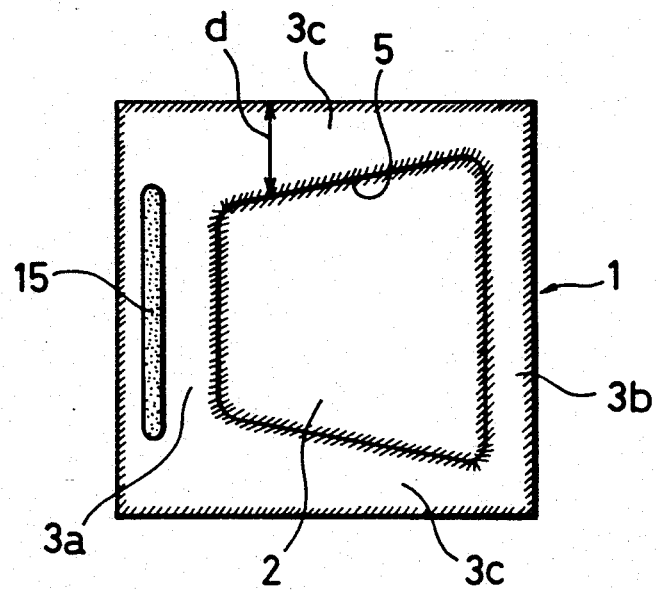
FIGS. 2(a) and (b) are plan views illustrating modified forms of the first embodiment.
Figure 2:
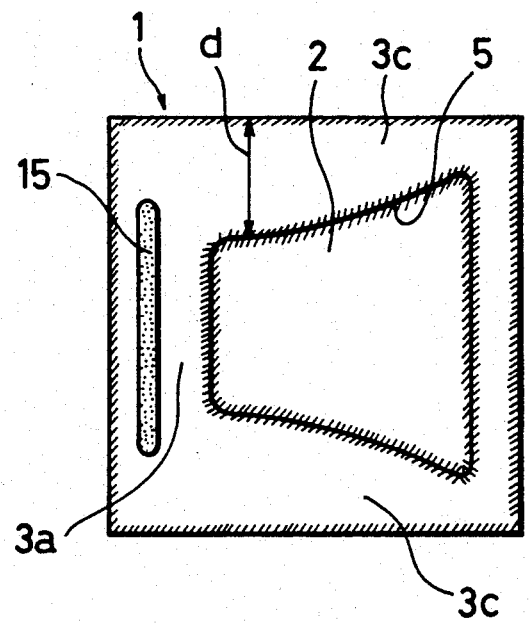

That is, the same effect as mentioned above could also be obtained by forming the recess 5 in the shape of a trapezoid as viewed from above as shown in FIG. 2(a) or by curving its oblique sides inwardly thereof as shown in FIG. 2(b).

Figure 3:
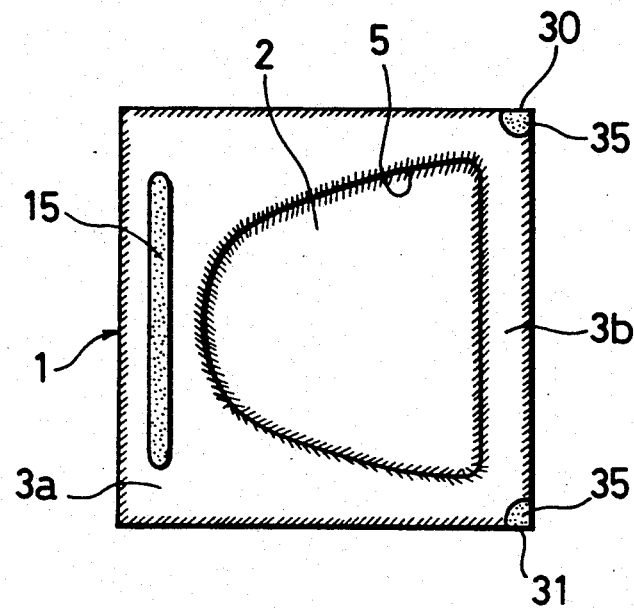
FIG. 3 is a plan view illustrating a second embodiment of the present invention.

It is also possible to prevent flapping of the resonator by fixing it to the case not only at the marginal portion 3a through an adhesive 15 coated thereon but also at either one of corners of the opposite marginal portion 3b through an adhesive 35 as depicted in FIG. 3.

The structure in which the quartz crystal block is fixed to the case at a plurality of points as mentioned above inevitably causes degradation of various characteristics, such as frequency variations, which is attributable to the difference in the coefficient of thermal expansion between the quartz crystal block and the case corresponding to the increased number of points where the former is fixed to the latter. In the case where the specifications required are not so severe, however, the above structure can well be used; hence, a substantial diminution in the possibility of breakage of the resonator by a shock or vibration more than compensates for the slight degradation of the above-mentioned various characteristics of the resonator.

Although in the above piezoelectric resonator according to the present invention has been described to be housed upside down in the case with the recess held downward, the piezo-resonator may also be housed with the recess held upward.

The embodiments of the invention have been described with respect to the case where the piezoelectric resonator is a quartz crystal resonator, but this should be construed as being merely illustrative of the invention and the invention is applicable as well to a filter element of a dual mode filter, a resonator or filter element using a piezoelectric substrate other than the quartz crystal one.

Moreover, although the embodiments have been described to employ the rectangular block of a piezoelectric material, this configuration is needed merely for providing enhanced mass productivity of the resonator by use of a batch system, and hence the present invention is not limited specifically thereto. That is to say, the present invention can equally be applied to resonators of circular, polygonal and other forms as viewed from above.

The present invention of the constitution described above is particularly effective in protecting the resonator held in the cantilever fashion from breakage by flapping which results from an external vibration or shock.

We claim:

1. A piezoelectric resonator comprising:
an ultrathin vibratory portion lying in a plane; and
a rib formed integrally with and surrounding said vibratory portion, said rib extending out of the plane of the vibratory portion and defining a first pair of opposing marginal portions and a second pair of opposing marginal portions;
wherein the width of each of said second pair of marginal portions in a direction parallel to the plane of the vibratory portion is larger at a portion adjacent one of said first marginal portions than at a portion adjacent the other of said first marginal portions.

2. The piezoelectric resonator as claimed in claim 1, wherein the width of each of said second pair of opposing marginal portions decreases gradually from said portion adjacent said one of said first pair of opposing marginal portions to said portion adjacent the other of said first pair of opposing marginal portions.

3. The piezoelectric resonator as claimed in claim 1, wherein said one of said first pair of marginal portions is fixed to a resonator case with an adhesive.

4. The piezoelectric resonator as claimed in claim 3, wherein the other of said first pair of marginal portions is fixed to the resonator case.

5. The piezoelectric resonator as claimed in any of claims 1-4, wherein the vibratory portion and the rib are formed of quartz crystal.

6. A piezoelectric resonator comprising a block of AT cut quartz crystal having a cavity formed in a substantially central portion of a side thereof, said cavity defining an ultrathin vibratory portion at a bottom surface thereof and a rib surrounding said cavity, wherein said rib comprises a first pair of opposing marginal portions and a second pair of opposing marginal portions, and wherein each of said second pair of marginal portions is thicker at a portion adjacent one of said first pair of opposing marginal portions than at a portion adjacent the other of said first marginal portions.

7. The piezoelectric resonator as claimed in claim 6, wherein the cavity is substantially cup-shaped.

8. The piezoelectric resonator as claimed in claim 6, wherein the cavity is substantially trapezoidal.

9. The piezoelectric resonator as claimed in claim 6, wherein said one of said first pair of marginal portions is fixed to a resonator case.

10. A piezoelectric multimode filter element comprising:

an ultrathin vibratory portion lying in a plane; and a rib formed integrally with and surrounding said vibratory portion, said rib extending out of the plane of the vibratory portion and defining a first pair of opposing marginal portions and a second pair of opposing marginal portions;

wherein the width of each of said second pair of marginal portions in a direction parallel to the plane of the vibratory portion is larger at a portion adjacent one of said first marginal portions than at a portion adjacent the other of said first marginal portions.

* * * * *